United States Patent [19]
Crumly et al.

[11] Patent Number: 6,109,369
[45] Date of Patent: Aug. 29, 2000

[54] CHIP SCALE PACKAGE

[75] Inventors: William Robert Crumly, Anaheim; Pete Henry Hudson, Escondido; Robert Joseph Cochrane, Riverside; Haim Feigenbaum; Eric Dean Jensen, both of Irvine, all of Calif.

[73] Assignee: Delphi Technologies, Inc., Troy, Mich.

[21] Appl. No.: 09/239,608

[22] Filed: Jan. 29, 1999

[51] Int. Cl.[7] .................................................. H05K 23/28
[52] U.S. Cl. ..................... 175/52.1; 361/707; 361/383; 361/600; 205/78; 257/675; 257/687; 257/712
[58] Field of Search ............................. 205/78; 174/52.2, 174/52.1, 675, 687, 712; 361/400, 401, 389, 707

[56] References Cited

U.S. PATENT DOCUMENTS

| | | | |
|---|---|---|---|
| 5,173,766 | 12/1992 | Long et al. | 257/687 |
| 5,285,352 | 2/1994 | Pastore et al. | 361/707 |
| 5,777,391 | 7/1998 | Nakamura et al. | 257/778 |

Primary Examiner—William A. Cuchlinski, Jr.
Assistant Examiner—Ronnie Mancho
Attorney, Agent, or Firm—Richard A. Jones

[57] ABSTRACT

A chip scale package includes a mandrel built flexible circuit having a circuit trace on a first surface and an aperture extending therethrough. The chip scale package includes a pad covering the aperture on the first surface of the flexible circuit and a raised interconnection member extending outwardly from the pad. The chip scale package also includes a chip secured to a second surface of the flexible circuit, such that the chip is electrically connected to the pad.

3 Claims, 1 Drawing Sheet

CHIP SCALE PACKAGE

TECHNICAL FIELD

The present invention relates generally to a chip scale package and, more particularly, to a chip scale package with a mandrel built flexible circuit lead frame.

BACKGROUND OF THE INVENTION

Electrical devices are commonly made up of individual components electrically connected together to form a single electrical circuit. An example of an electrical component well known in the art is a printed circuit board. Another example is a flexible printed circuit board, also known as a flexible circuit. Still another example is an integrated circuit, also referred to in the art as an IC chip. Advantageously, the IC chip may be electrically connected to a printed circuit board.

A typical IC chip is relatively small, such as a quarter of an inch in diameter, while the printed circuit board may be significantly larger. Previously, the chip has been included in a larger assembly, hereinafter referred to as a chip package, in order to provide sufficient surface area to electrically connect the chip to the printed circuit board. An example of a chip package includes a chip bonded to a lead frame. The lead frame is of sufficient size to make the electrical connection between a lead from the lead frame and another electrical device, such as a printed circuit board.

More recently, the chip has been included in a smaller assembly, approximately the same size as the chip, hereinafter referred to as a chip scale package. One example of a chip scale package includes a chip attached to a flexible circuit. A circuit trace within the flexible circuit performs a similar function as the leads of the lead frame. The traces in the flexible circuit are electrically connected to a first pad. The chip is bonded to the first pad such as with an adhesive. The chip is electrically connected to the first pad such as by wire bonding. A second pad is positioned on the other side of the flexible circuit opposite the first pad, and a plated through-hole electrically connects the pads. The second pad includes a plurality of solder balls. The solder balls serve as an electrical contact, to electrically connect the chip scale package to another electrical device, such as a printed circuit board.

A characteristic of the described chip scale package is that its reduced size makes it difficult to build, since it is difficult to route the circuit traces around the through-hole. Also, the narrow pitch between the solder balls makes it difficult to escape a wire from between the solder balls, in connecting the chip to another electrical device. Thus, there is a need in the art for a chip scale package that is more efficient to build and includes a more positive electrical contact for connecting the chip to another electrical device.

SUMMARY OF THE INVENTION

Accordingly, the present invention is a chip scale package. The chip scale package includes a mandrel built flexible circuit having a circuit trace on a first surface and an aperture extending therethrough. The chip scale package includes a pad covering the aperture on the first surface of the flexible circuit and a raised interconnection member extending outwardly from the pad. The chip scale package also includes a chip secured to a second surface of the flexible circuit, such that the chip is electrically connected to the pad. One advantage of the present invention is that a chip scale package is provided that is small in size, but still provides sufficient surface area to interconnect the chip scale package to another electrical device. Another advantage of the present invention is that the chip scale package includes a lead frame that is a flexible circuit. Still another advantage of the present invention is that the flexible circuit is built on a mandrel. Yet another advantage of the present invention is that the flexible circuit contains a raised interconnection member that provides an electrical connection to another electrical device. A further advantage of the present invention is that the mandrel built flexible circuit is more efficient to produce, since there is only one pad and no plated through-hole electrical interconnection. Other features and advantages of the present invention will be readily appreciated as the same becomes better understood after reading the subsequent description when considered in connection with the accompanying drawings.

DESCRIPTION OF THE PREFERRED EMBODIMENT

Figure 1:
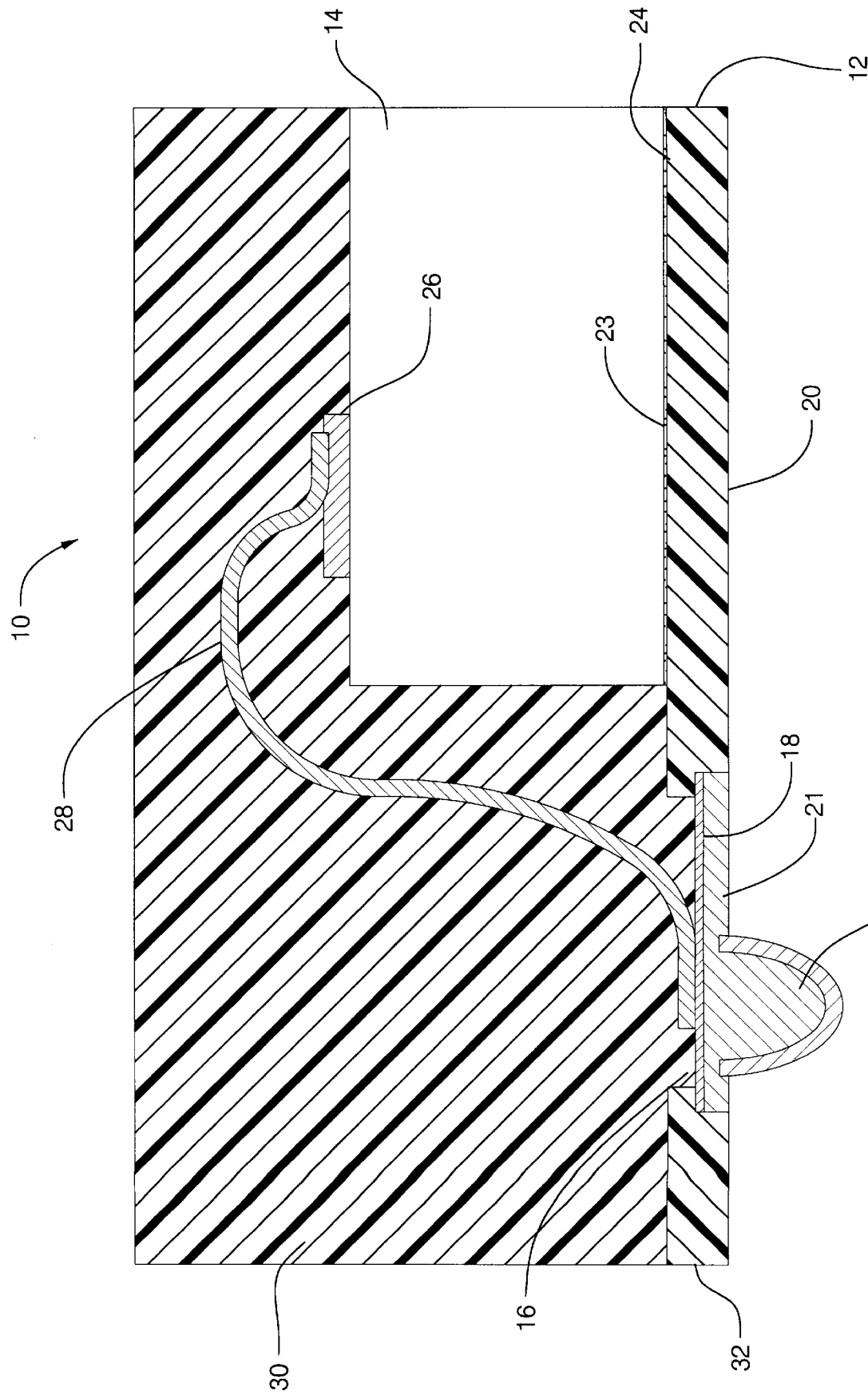
FIG. 1 is an elevational side view of a chip scale package illustrating features of the present invention.

Referring to FIG. 1, one embodiment of a chip scale package 10 is illustrated. The chip scale package 10 includes a leadframe, which facilitates an electrical interconnection between an IC chip 14 and another electrical device (not shown). In this example, the leadframe is a mandrel built flexible circuit 12, as is known in the art. For example, to construct a mandrel built flexible circuit 12, a mandrel (not shown) is provided having a forming surface including a predetermined depression. The mandrel is coated with a copper material, such as by flash plating. A predetermined circuit (not shown) is imaged in photoresist on the mandrel. An electroforming process using a conductive material, such as nickel and copper, is used to build up the circuit. The resist is stripped off of the mandrel. A dielectric coverlay film is laminated over the circuit on the mandrel. An example of such a film is a material known as Kapton. Preferably, the coverlay may contain holes that, after lamination, are coincident with a pad in the circuit. While still on the mandrel, a layer of a material, such as nickel and a layer of gold, is plated onto the pads using the coverlay as a plating resist. The flex is then removed from the mandrel and flash etched, exposing the nickel surface on the other side of the circuit. A layer of electroless gold or tin-lead may be plated onto the nickel surface to establish a solderable surface.

A further example of how a mandrel built flexible circuit is constructed is disclosed in a commonly assigned U.S. Pat. No. 5,207,887 to Crumly, et al., which issued on May 4, 1993, entitled SEMI-ADDITIVE CIRCUITRY WITH RAISED FEATURES USING FORMED MANDRELS, the disclosure of which is hereby incorporated by reference.

The chip scale package 10 includes an aperture 16 extending therethrough the flexible circuit 12 in a predetermined position. The chip scale package 10 also includes a circuit (not shown), which is defined by a plurality of circuit traces connected to a pad 18 on the flexible circuit 12. It should be appreciated that, in this example, the circuit traces are only positioned on a first surface 20 of the flexible circuit 12. Advantageously, the circuit traces provide an electrical connection between the chip 14 and another electrical device (not shown), in a manner to be described.

The chip scale package 10 also includes a pad 18 positioned over the aperture 16. Preferably, the pad 18 is formed from an electrically conductive material, such as nickel or copper. The chip scale package 10 further includes an outwardly extending raised interconnection member 20 positioned on a first side of the pad 18. Preferably the raised interconnection member 20 is a protrusion or bump made from an electrically conductive material, as previously described. The raised interconnection member 22 increases the surface area of the interconnection between the chip scale package 10 and another electrical device. For example, the increased surface area improves adhesion between solder and the chip scale package 10, or between a conductive adhesive and the chip scale package. Advantageously, the raised interconnection member 22 may also act as a pressure contact for temporarily interconnecting the chip scale package to another electrical device, thus providing a pocketable chip scale package 10 interconnect.

The chip scale package 10 includes a chip 14, such as an integrated circuit chip, bonded to a second surface 24 of the flexible circuit, preferably with an adhesive. The chip 14 may include a second electrically conductive pad 26 integral with the chip 14. The chip scale package 10 includes a wire bond 28 to electrically connect the chip 14 to the pad 18, through the aperture 16 in the flexible circuit 12. It should be appreciated that the second surface 24 of the flexible circuit 12 does not include a pad 18. Alternatively, the electrical connection can be made through a flip chip (not shown) and underfill method, as is also known in the art.

The chip scale package 10, including the chip 14 and second surface 24 of the flexible circuit 12, are encapsulated with an encapsulating material 30. A preferred encapsulation technique is molding under pressure. Advantageously, the encapsulate 30 protects the chip 14 from damage.

Preferably, a plurality of chip scale packages 10 may be produced from a large section of flexible circuit 12. For example, the chip scale packages 10 may be prepared as previously described. Edges 32 of individual chip scale packages 10 are defined, so that each individual chip scale package 10 may be separated using a punch process, as is known in the art.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A chip scale package comprising:
   a flexible circuit having a circuit trace only on a first surface of said flexible circuit,
   an aperture extending into said flexible circuit from a second surface;
   a first pad on said circuit trace of said flexible circuit disposed in said aperture;
   a raised interconnection member extending outwardly from said pad and from the first surface of said flexible circuit;
   a chip secured to said second surface of said flexible circuit,
   a second pad integral with said chip,
   a wire bonded to said first pad and said second pad whereby said chip is electrically connected to said first pad, and
   said wire, said first pad and said second pad being encapsulated with an encapsulating material.

2. A chip scale package as set forth in claim 1 wherein said chip is bonded to said second surface of said flexible circuit with an adhesive.

3. A chip scale package comprising:
   a leadframe, wherein said leadframe is a flexible circuit having a first surface and a second surface and a circuit trace only on said first surface;
   an aperture extending into said flexible circuit from said second surface;
   a first electrically conductive pad integral with said circuit trace and positioned in said aperture beneath said circuit trace on said first surface of said flexible circuit;
   an electrically conductive raised interconnection member extending outwardly from said first pad;
   a chip bonded to said second surface of said flexible circuit;
   a second electrically conductive pad integral with said chip; and
   a wire bonded to said first pad and said second pad through said aperture to electrically connect said chip to said first pad.

* * * * *